United States Patent [19]
Erhart et al.

[11] Patent Number: 5,440,256
[45] Date of Patent: Aug. 8, 1995

[54] DUAL MODE TRACK AND HOLD DRIVERS FOR ACTIVE LCD'S

[75] Inventors: Richard A. Erhart, Chandler; DeWitt Ong, Tempe, both of Ariz.

[73] Assignee: Medtronic, Inc., Minneapolis, Minn.

[21] Appl. No.: 977,320

[22] Filed: Nov. 17, 1992

[51] Int. Cl.⁶ .................................. H03K 5/159
[52] U.S. Cl. .................................................. 327/94
[58] Field of Search ............................. 327/91, 94, 96

[56] References Cited

U.S. PATENT DOCUMENTS

| | | | |
|---|---|---|---|
| 4,728,811 | 3/1988 | Iida et al. | 327/91 |
| 4,922,130 | 5/1990 | Swerlein | 327/94 |
| 5,124,576 | 6/1992 | Jensen | 327/94 |
| 5,315,170 | 5/1994 | Vinn et al. | 327/94 |

Primary Examiner—Willis R. Wolfe
Attorney, Agent, or Firm—Harold R. Patton

[57] ABSTRACT

A track and hold signal processing system is capable of driving 256 gray scale active matrix LCD displays at speeds limited only by the electrical characteristics of the display. The quiescent power dissipated by the system is substantially less than known track and hold drivers due to separation of the tracking circuit from the hold circuit resulting in optimization of the tracking function.

5 Claims, 4 Drawing Sheets

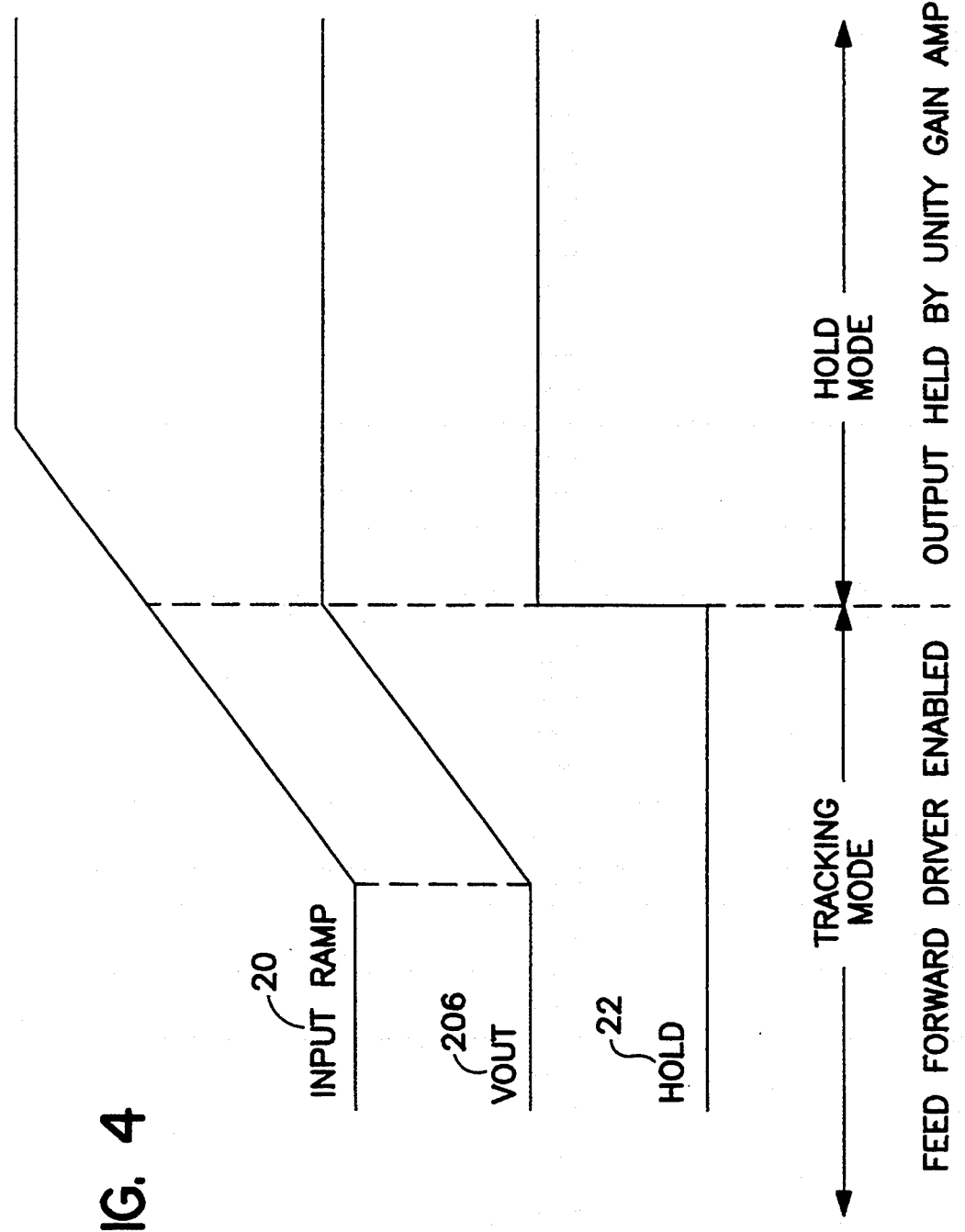

DUAL MODE TRACK AND HOLD DRIVERS FOR ACTIVE LCD'S

BACKGROUND OF THE INVENTION

1. Field of the Invention

The present invention pertains to liquid crystal display (LCD) drivers, and in particular pertains to a signal processing system which will drive large active matrix LCD displays at high speeds without sacrificing quiescent current as in known amplifier configurations used to drive an active matrix LCD display.

2. Description of the Prior Art

Military and commercial applications for flat panel, active matrix LCD's are growing. There is a need for "next generation" IC's which can take full advantage of the capabilities of current and upcoming active matrix displays by providing extreme image accuracy with a large number of gray levels. Space is a primary concern in applications using flat panel displays.

Active matrix displays can provide advantages over conventional LCD's in the areas of viewing angle, response time and information content. Military and commercial applications such as cockpit displays, mapping displays and imaging systems can utilize these features to create extremely accurate image reproductions. A new generation of complex mixed signal driver chips are required to implement these systems.

Current system architectures for LCD drivers employ both row and column driver IC's. The column driver is a high speed chip having responsibility for accurate generation of the gray shade voltage levels. These IC's need to be fast, handle large voltages, have a multitude of outputs, provide low offset error, contain tens of thousands of transistors, and yet minimize power. These conflicting design issues require careful analysis in the light of current IC technology.

In previous active matrix driver chips, power consumption was not an issue due to the relatively slow speed of the chips and the low number of gray scales provided. In a 256 gray level display however, both quiescent power consumption and speed are critical electrical issues affecting system performance. Thus, there exists a need in the art for an active matrix driver chip which is capable of driving large resistive/capacitance loads in a very short time period while simultaneously holding a particular voltage with extreme accuracy and without sacrificing quiescent current.

SUMMARY OF THE INVENTION

The present invention is a monolithic IC which functions as a dual mode driver for the column of an active matrix display. Multiple copies of the invention are utilized to drive multiple columns of an active matrix display whose load is typically a distributed RC (resistance/capacitance).

An input ramp (or other analog waveform) is input to all of the dual mode drivers. An independent hold signal (input timing signal) is also input to the dual mode drivers.

The drivers have two simple states, track and hold. During the tracking mode the drivers follow the input ramp signal and drive its equivalent on the display. When the hold signal is activated, the drivers hold the present value of the ramp input.

A separate tracking driver is used in parallel with a hold driver to optimize the tracking function rather than incorporating both tracking and hold functions in a series configuration. This permits optimization of the hold driver as well.

Significant aspects and features of the present invention include a feed forward tracking driver which handles the tracking function independently and in parallel with the hold function. As a result, the driver amplifier merely has to hold a present input signal value without having to slew the load. This feature yields lower output offsets, larger capacitive load drive capability and faster operating speeds available with prior track and hold art.

Yet, another significant aspect and feature is the ability to be completely integrated. Along with integration comes the following: more reliable, takes less space, costs less, and versatile for different customer requirements. Also, the inventory management is one device which can now do the job of many devices.

BRIEF DESCRIPTION OF THE DRAWINGS

Other objects of the present invention and many of the attendant advantages of the present invention will be readily appreciated as the same becomes better understood by reference to the following detailed description when considered in connection with the accompanying drawings, in which like reference numerals designate like parts throughout the figures thereof and wherein:

FIG. 4 illustrates the input and output of the present invention.

DETAILED DESCRIPTION OF THE PREFERRED EMBODIMENT

Figure 1:
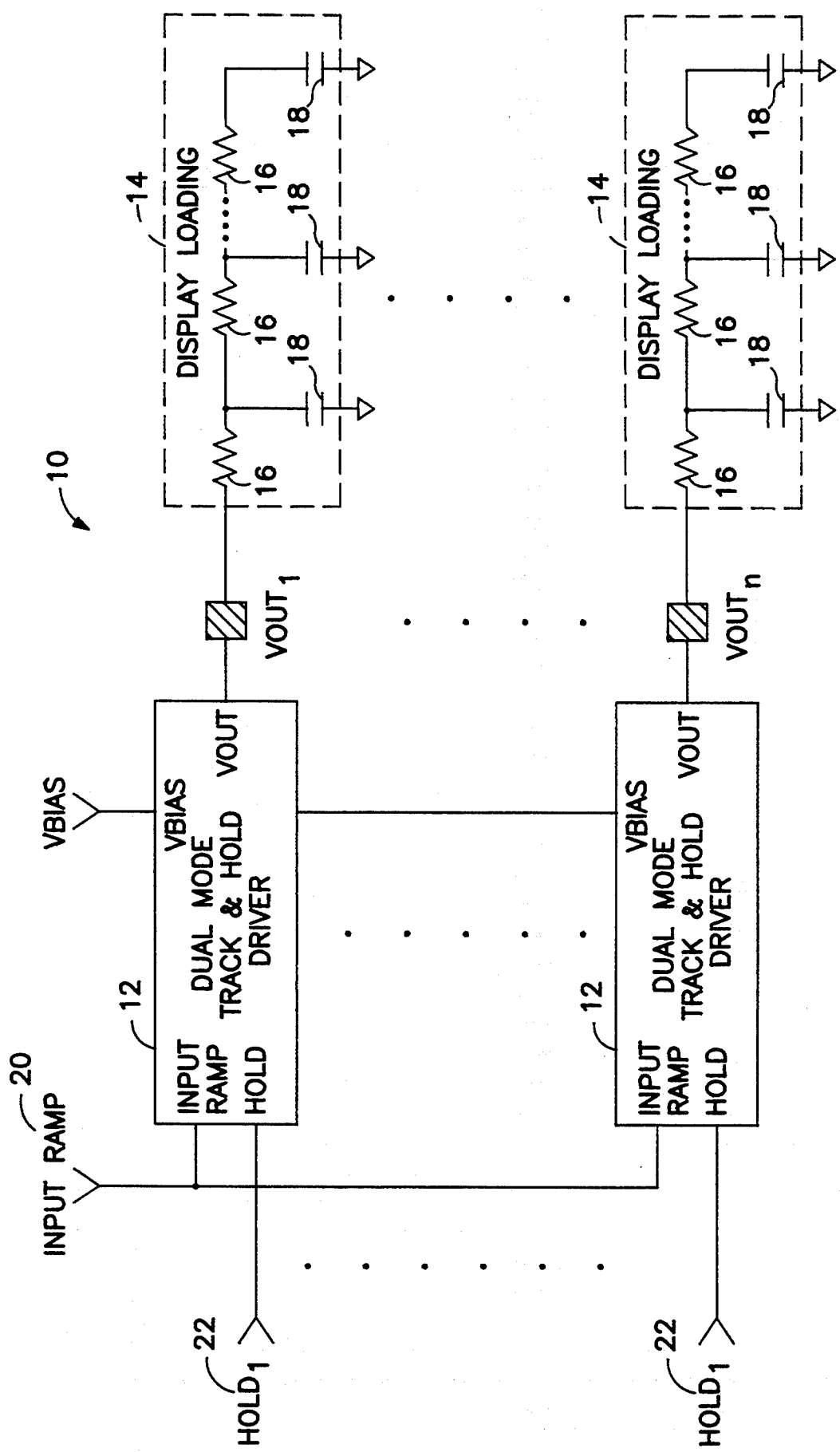
FIG. 1 illustrates a block diagram of a system configured to use the present invention.

FIG. 1 is a block diagram of a system 10 of inventive drivers 12 functioning as drivers for the column of an active matrix display. Multiple copies of the present invention 12 are utilized to drive multiple columns of an active matrix display whose load 14 is typically a distributed RC 16, 18.

An input ramp 20 (or other analog waveform) is input to all of the dual mode drivers 12. An input timing (hold) signal 22 is also input to the dual mode drivers 12, one independent timing (hold) signal 22 per driver 12.

The drivers 12 have two simple states, track and hold. During the tracking mode, the drivers 12 follow the input ramp signal 20 and drive its equivalent on the display 14. When the timing signal 22 is activated, the drivers 12 hold the present value of the ramp input signal 20.

Figure 2:
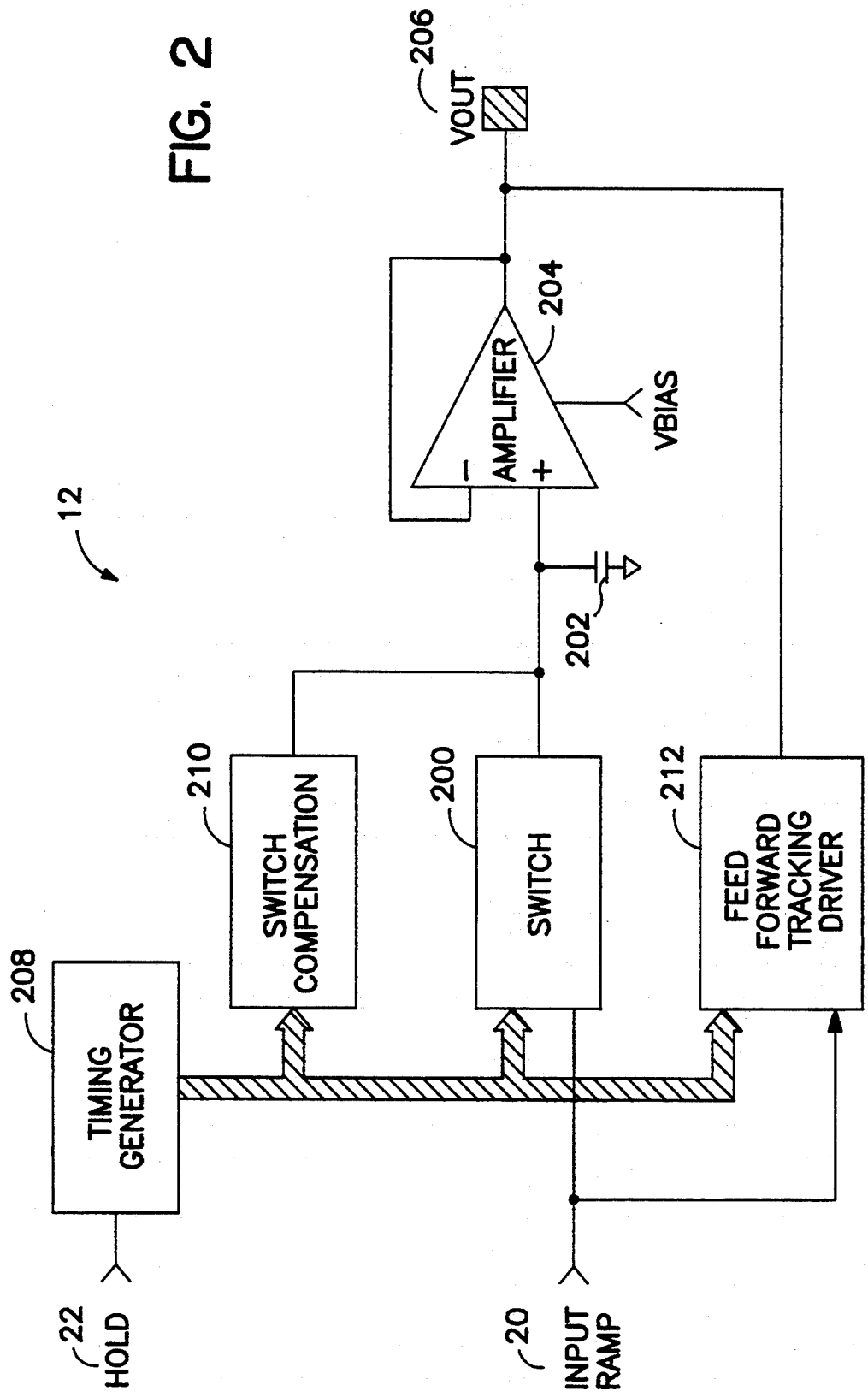
FIG. 2 illustrates a block diagram of the present invention.

Moving now to FIG. 2, a block diagram of the inventive dual mode track and hold driver 12 is illustrated. The input ramp 20 is fed through a switch 200 to a capacitor 202. The switch 200 is closed during the tracking mode, so the capacitor 202 voltage matches that of the input ramp 20. The voltage on the capacitor 202 is fed to an amplifier 204 in a unity gain configuration, so that VOUT 206 follows the capacitor 202 voltage which in turn follows the input ramp 20.

When switch 200 is opened, the input ramp voltage 20 at that instant is captured on the capacitor 202 and this voltage is held and driven out by the amplifier 204. There are two problems with this approach.

First, when gating the switch 200 off, parasitic capacitances between the gate and the output node of switch 200 cause unwanted charge injection to the capacitor 202, changing the actual voltage representative of the input ramp 20;

Second, the large capacitive loads 18 on an active matrix display 14 require high current drivers. The design of unity gain amplifiers becomes more difficult and consumes more dc power. If such amplifiers are designed to pass high currents, then higher output offsets are yielded. A low current driver does not have these problems, but cannot drive the loads during tracking. The hereinbefore described problems have been solved in the preferred embodiment of the present invention by:

adding a timing generator 208, a switch compensation circuit 210 and a feed forward tracking driver 212. The switch compensation circuit 210 has gates transitioned such that opposite charge is injected into capacitor 202, thereby eliminating the unwanted charge injected as a result of the parasitic capacitances inherent in switch 200. The timing generator 208 controls the gates of the switch 200 and the compensator 210. The switching times of the switch 200, the compensation 210 and the feed forward circuit 212 are critical to the operation of the preferred embodiment 12.

The feed forward tracking driver 212 handles the tracking function. The amplifier 204 merely has to hold the present value and does not have to slew the load. This driver 212 can be a simple NMOS or PMOS switch, a CMOS transmission gate or can even be a source follower type amplifier. A source follower would add an offset, but this could be corrected by the unity gain amplifier 204 in the hold mode.

Figure 3:
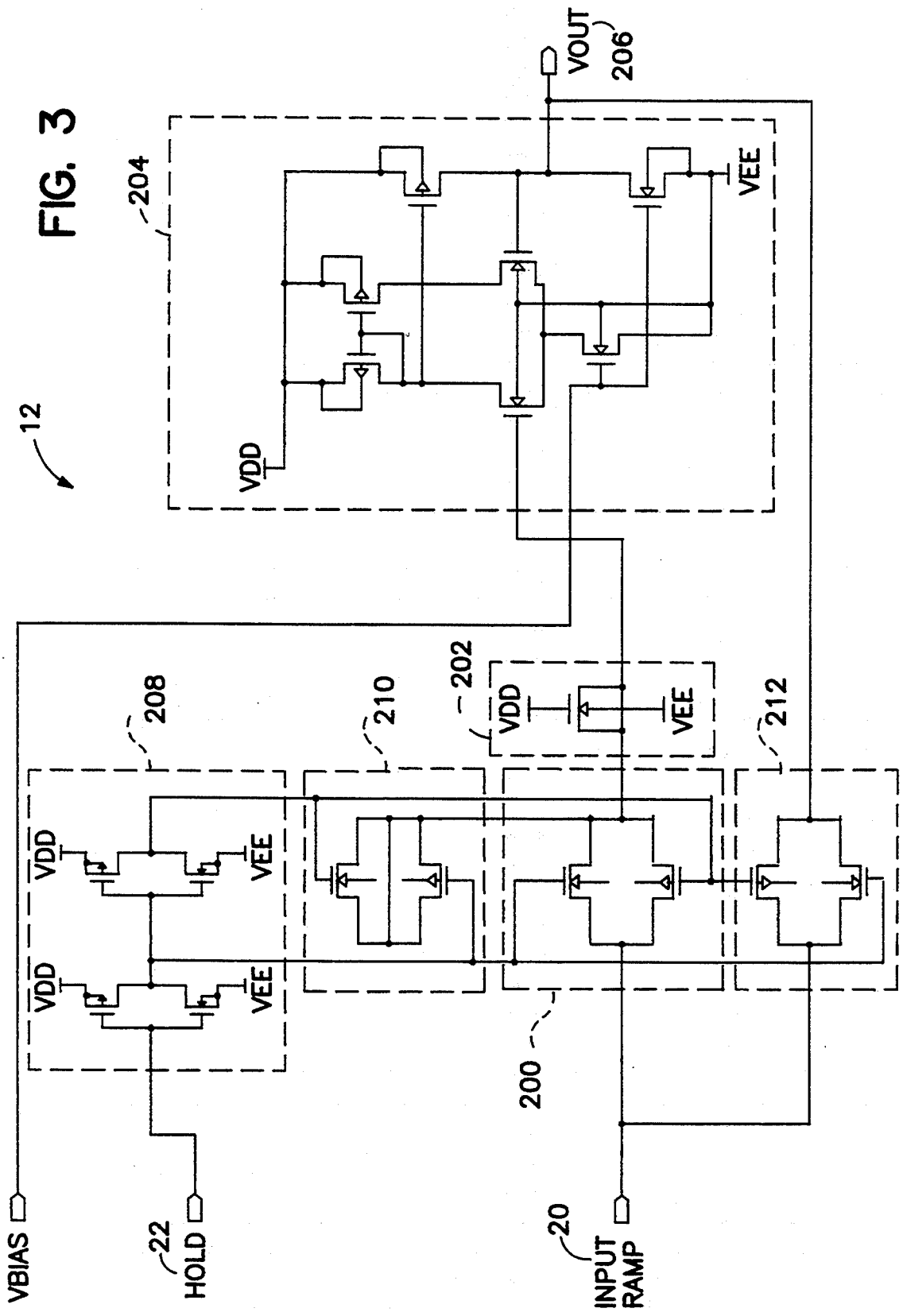
FIG. 3 is a circuit diagram illustrating the present invention.

FIG. 3 is a circuit diagram of the preferred embodiment of the dual mode track and hold driver 12 which has been described in detail hereinbefore with the aid of FIG. 2. Nothing more will be added.

FIG. 4 simply illustrates the timing relationships between the input ramp 20, VOUT 206 and the input timing (hold) signal 22, and has been included to better clarify the operation of the preferred embodiment of the inventive dual mode track and hold driver 12.

While the invention has been described above in connection with a particular embodiment, one skilled in the art will appreciate that the invention is not necessarily so limited. It will thus be understood that numerous other embodiments, examples, uses, modifications of, and departures from the teachings disclosed may be made, without departing from the scope of the present invention as claimed herein.

We claim:

1. A monolithic signal processing system for tracking a variable input signal and holding a signal value representing said variable input signal at a predetermined time, said signal processing system comprising:
   (a) switching means coupled to said variable input signal for sampling said variable input signal, said switching means shifting between a first state and a second state in response to a second input signal;
   (b) capacitor means responsively coupled to said switching means, said capacitor holding said signal value during said second state;
   (c) buffering means coupled to said capacitor means for generating a reproduction of said signal value; and
   (d) tracking means responsively coupled to said switching means and said variable input signal, said tracking means coupling said variable input signal to said generated signal during said first state and decoupling said variable input signal from said generated signal during said second state.

2. The signal processing system of claim 1 further comprising switch compensation means for eliminating excessive charge injection to said capacitor means resulting from said shifting between said first and second states, said excessive charge being unrelated to said variable input signal.

3. The signal processing system of claim 2 further comprising a timing generator for controlling said shifting between said first and said second states of said switching means, and further controlling said switch compensation means.

4. The signal processing system of any one of claims 1, 2 or 3 wherein said tracking means is a CMOS switch.

5. The signal processing system of any one of claims 1, 2 or 3 wherein said tracking means is a source follower amplifier.

* * * * *